US009158885B1

(12) United States Patent
Gray et al.

(10) Patent No.: US 9,158,885 B1
(45) Date of Patent: Oct. 13, 2015

(54) REDUCING COLOR CONFLICTS IN TRIPLE PATTERNING LITHOGRAPHY

(71) Applicant: International Business Machines Corporation, Armonk, NY (US)

(72) Inventors: Michael S. Gray, Fairfax, VT (US); Matthew T. Guzowski, Essex Junction, VT (US); Alexander Ivrii, Haifa (IL); Lars W. Liebmann, Poughquag, NY (US); Kevin W. McCullen, Essex Junction, VT (US); Gustavo E. Tellez, Essex Junction, VT (US); Michael Gester, Bonn (DE)

(73) Assignee: GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 14/278,974

(22) Filed: May 15, 2014

(51) Int. Cl.
 *G06F 17/50* (2006.01)

(52) U.S. Cl.
 CPC .................................. *G06F 17/5081* (2013.01)

(58) Field of Classification Search
 CPC .......................................................... G03F 1/144
 USPC ............................................................ 716/52
 See application file for complete search history.

(56) References Cited

U.S. PATENT DOCUMENTS

| | | | |
|---|---|---|---|
| 6,622,288 B1 * | 9/2003 | Wang et al. | 716/52 |
| 8,484,607 B1 * | 7/2013 | Tang et al. | 716/136 |
| 8,584,060 B1 * | 11/2013 | Brearley et al. | 716/55 |
| 8,677,291 B1 * | 3/2014 | Yuan et al. | 716/55 |
| 2011/0078638 A1 * | 3/2011 | Kahng et al. | 716/52 |
| 2014/0007026 A1 | 1/2014 | Chen et al. | |
| 2014/0359544 A1 * | 12/2014 | Hsu et al. | 716/55 |

OTHER PUBLICATIONS

Yu et al., "Triple Patterning Lithography (TPL) Layout Decomposition using End-Cutting," 2013, 9 pages, SPIE, retrieved from: http://www.cerc.utexas.edu/~bei/papers/C16_SPIE2013_TPLEC.pdf.
Yu et al., "Layout Decomposition for Triple Patterning Lithography," 2011, 31 pages, ICCAD2011 1A.1, UT DA.
Yu et al., "Layout Decomposition for Triple Patterning Lithography," 2011, pp. 1-8, 2011, IEEE.
Ghaida et al., "A Novel Methodology for Triple/Multiple-Patterning Layout Decomposition," 8 pages, IBM Corporation, retrieved from: nanocad.ee.ucla.edu/pub/Main/Publications/C63_paper.pdf.
Fang et al., "A Novel Layout Decomposition Algorithm for Triple Patterning Lithography," 2012, pp. 1181-1186, Design Automation Conference (DAC), 2012 49th ACM/EDAC/IEEE.
Tian et a., "A Polynomial Time Triple Patterning Algorithm for Cell Based Row-Structure Layout," 2012, pp. 57-64, Computer-Aided Design (ICCAD), 2012 IEEE/ACM International Conference.
Kuang et al., "An Efficient Layout Decomposition Approach for Triple Patterning Lithography," 2013, pp. 1-6, Design Automation Conference (DAC), 50th ACM/EDAC/IEEE.
Ma et al., "Triple Patterning Aware Routing and Its Comparison with Double Patterning Aware Routing in 14nm Technology," 2012, pp. 591-596, Design Automation Conference (DAC), 2012 49th ACM/EDAC/IEEE.

* cited by examiner

*Primary Examiner* — Suresh Memula
(74) *Attorney, Agent, or Firm* — David Cain; Hoffman Warnick LLC

(57) ABSTRACT

Methods of the present disclosure can include: using a computing device to perform actions including: applying a design rule check (DRC) on a proposed integrated circuit (IC) layout, wherein the DRC applies a set of restrictive design rules (RDRs) in response to the proposed IC layout being a contact area (CA) layout; computing a conflict graph for the proposed IC layout in response to one of the IC layout being a metal layer layout and the set of RDRs being satisfied; determining whether the IC layout is one of non-colorable, indeterminate, partially colorable, and fully colorable; and partially coloring the IC layout and identifying non-colorable nodes in response to the IC layout being indeterminate or partially colorable.

20 Claims, 13 Drawing Sheets

REDUCING COLOR CONFLICTS IN TRIPLE PATTERNING LITHOGRAPHY

BACKGROUND

The present invention relates generally to the design and manufacture of integrated circuits, and more specifically, to methods for adding color to design shapes in such a way so as to minimize conflicts in triple patterned designs.

An integrated circuit ("IC") is a device (e.g., a semiconductor device) or electronic system that includes many electronic components, such as transistors, resistors, diodes, etc. These components can be interconnected to form multiple circuit components, such as gates, cells, memory units, arithmetic units, controllers, decoders, etc. An IC includes multiple layers of wiring that interconnect its electronic and circuit components.

Design engineers typically design ICs by transforming logical or circuit descriptions of the IC's components into geometric descriptions, called design layouts. IC design layouts can include: (1) circuit modules (i.e., geometric representations of electronic or circuit IC components) with pins, and (2) interconnect lines (i.e., geometric representations of wiring) that connect the pins of the circuit modules. A net is typically defined as a collection of pins that need to be connected. In this fashion, design layouts often describe the behavioral, architectural, functional, and structural attributes of the IC.

To create the design layouts, design engineers typically use electronic design automation ("EDA") applications. These applications provide sets of computer-based tools for creating, editing, analyzing, and verifying design layouts.

Fabrication foundries ("fabs") manufacture ICs based on the design layouts using a photolithographic process. Photolithography is an optical printing and fabrication process by which patterns on a photolithographic mask (i.e., photomask) are imaged and defined onto a photosensitive layer coating a substrate. To fabricate an IC, photomasks are created using the IC design layout as a template. The photomasks contain the various geometries (i.e., features) of the IC design layout. The various geometries contained on the photomasks correspond to the various base physical IC elements that make up functional circuit components such as transistors, interconnect wiring, via pads, as well as other elements that are not functional circuit elements but are used to facilitate, enhance, or track various manufacturing processes. Through sequential use of the various photomasks corresponding to a given IC in an IC fabrication process, a large number of material layers of various shapes and thicknesses with various conductive and insulating properties may be built up to form the overall IC and the circuits within the IC design layout.

Constraining factors in traditional photolithographic processes limit their effectiveness as circuit complexity continues to increase and transistor designs become more advanced and ever smaller in size (i.e., die shrink). Some such constraining factors are the lights/optics used within the photolithographic processing systems. Specifically, the light/optical tools or techniques available for use may be limited due to physical limitations (e.g., wavelength and aperture) of the photolithographic process. Therefore, the photolithographic process cannot print beyond a certain pitch, distance, and other such physical manufacturing constraints.

A pitch specifies a sum of the width of a feature and the space on one side of the feature separating that feature from a neighboring feature. Depending on the photolithographic process being used, factors such as optics and wavelengths of light or radiation restrict how small the pitch can be before features can no longer be reliably printed to a wafer or mask. As such, the pitch limits the smallest size of any features that can be created on a wafer.

With the advance of ultra deep submicron technology, the feature size and feature pitch get so small that existing lithography processes cannot print the shapes represented by the features. On the other hand, there are difficulties in the practical use of advanced photolithographic processes (e.g., extreme ultra violet (EUV)). Therefore, the current lithography technology is expected to be used for next generation silicon technology. To compensate for the difficulty in printing the shape of small pitches, multiple patterning lithography is recognized as a promising solution for 22 nm and sub-22 nm (e.g., 16 nm) volume IC production. Multiple patterning lithography technology generally decomposes a single layer of a layout into multiple masks and applies multiple exposures to print the shapes in the layer. The decomposition provided by multiple patterning lithography increases shape printing pitch and improves the depth of focus.

Double patterning lithography is one type of multiple patterning lithography technology that has been in use for some time. Double patterning lithography generally involves placing shapes that are too close to each other to be assigned to the same mask layer, onto two different mask layers in order to satisfy spacing requirements specified in the design layout. These two different mask layers are then used to print one design layer. However, for a dense layer of a layout (e.g. a first metal level (referred to herein as M1) or a local interconnect (referred to herein as CA) layer), double patterning lithography may not be capable of printing the shapes of the layer while maintaining the corresponding pitch spacing requirements. Other multiple patterning lithography options such as triple patterning lithography, however, may be sufficient in this situation.

A color conflict, as described herein, refers to a situation where two shapes in a design layout are separated by a smaller distance than the minimum separation distance of a single layer (referred to herein as a "mask layer distance"). In this situation, the two shapes cannot be assigned to two different colors. When a color conflict exists, the shapes of the layout cannot be fabricated according to the current assignment of colors for other shapes because the conflicting shapes cannot be fabricated in the same layer. Thus, any potential color conflicts should be identified before fabrication occurs in order to make proper changes or adjustments to the proposed IC layout. A prerequisite to manufacturing the IC layout can therefore include successfully assigning colors to each shape in the layout.

SUMMARY

A first aspect of the present disclosure provides a method for reducing color conflicts in triple patterned Integrated Circuit (IC) designs, the method comprising: using a computing device to perform actions including: applying a design rule check (DRC) on a proposed IC layout, wherein the DRC applies a set of restrictive design rules (RDRs) in response to the proposed IC layout being a local interconnect (CA) layout, the set of RDRs including: forbidding two opposing pairs of shape line ends from being positioned less than a minimum different color distance apart, wherein the minimum different color distance is a minimum separation between two shapes assigned to different colors; forbidding each shape line from being at less than a mask layer distance from more than two shapes in a particular adjacent row, wherein the mask layer distance is a minimum separation between two shapes assigned to a single color; and forbidding two pairs of opposing ends of each shape line from being at less than the mask layer distance from an adjacent shape; computing a conflict graph for the proposed IC layout in response to one of the IC layout being a metal layer and the set of RDRs being satisfied; determining whether the conflict graph is one of non-colorable, indeterminate, partially colorable, and fully colorable; and partially coloring the IC layout and identifying non-colorable shapes in response to the conflict graph being indeterminate or partially colorable.

A second aspect of the present disclosure provides a program product stored on a computer readable storage medium, the program product operative to reduce color conflicts in triple patterned Integrated Circuit (IC) designs when executed, the computer readable storage medium comprising program code for: applying a design rule check (DRC) on a proposed IC layout, wherein the DRC applies a set of restrictive design rules (RDRs) in response to the proposed IC layout being a local interconnect (CA) layout, the set of RDRs including: forbidding two opposing pairs of shape line ends from being positioned less than a minimum different color distance apart, wherein the minimum different color distance is a minimum separation between two shapes assigned to different colors; forbidding each shape line from being at less than a mask layer distance from more than two shapes in a particular adjacent row, wherein the mask layer distance is a minimum separation between two shapes assigned to a single color; and forbidding two pairs of opposing ends of each shape line from being at less than the mask layer distance from an adjacent shape; computing a conflict graph for the proposed IC layout in response to one of the IC layout being a metal layer and the set of RDRs being satisfied; determining whether the conflict graph is one of non-colorable, indeterminate, partially colorable, and fully colorable; and partially coloring the IC layout and identifying non-colorable shapes in response to the conflict graph being indeterminate or partially colorable.

A third aspect of the present disclosure provides a system for reducing color conflicts in triple patterned Integrated Circuit (IC) designs, the system comprising: a design rule check (DRC) component configured to examine a proposed IC layout, wherein the DRC component applies a set of restrictive design rules (RDRs) in response to the proposed IC layout being a local interconnect (CA) layout, the set of RDRs including: forbidding two opposing pairs of shape line ends from being positioned less than a minimum different color distance apart, wherein the minimum different color distance is a minimum separation between two shapes assigned to different colors; forbidding each shape line from being at less than a mask layer distance from more than two shapes in a particular adjacent row, wherein the mask layer distance is a minimum separation between two shapes assigned to a single color; and forbidding two pairs of opposing ends of each shape line from being at less than the mask layer distance from an adjacent shape; a computing component configured to compute a conflict graph for the proposed IC layout in response to one of the IC layout being a metal layer and the set of RDRs being satisfied; a determinator component configured to determine whether the conflict graph is one of non-colorable, indeterminate, partially colorable, and fully colorable; and an assignor component configured to partially color the IC layout and identifying non-colorable shapes in response to the conflict graph being indeterminate or partially colorable.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

Figure 1:
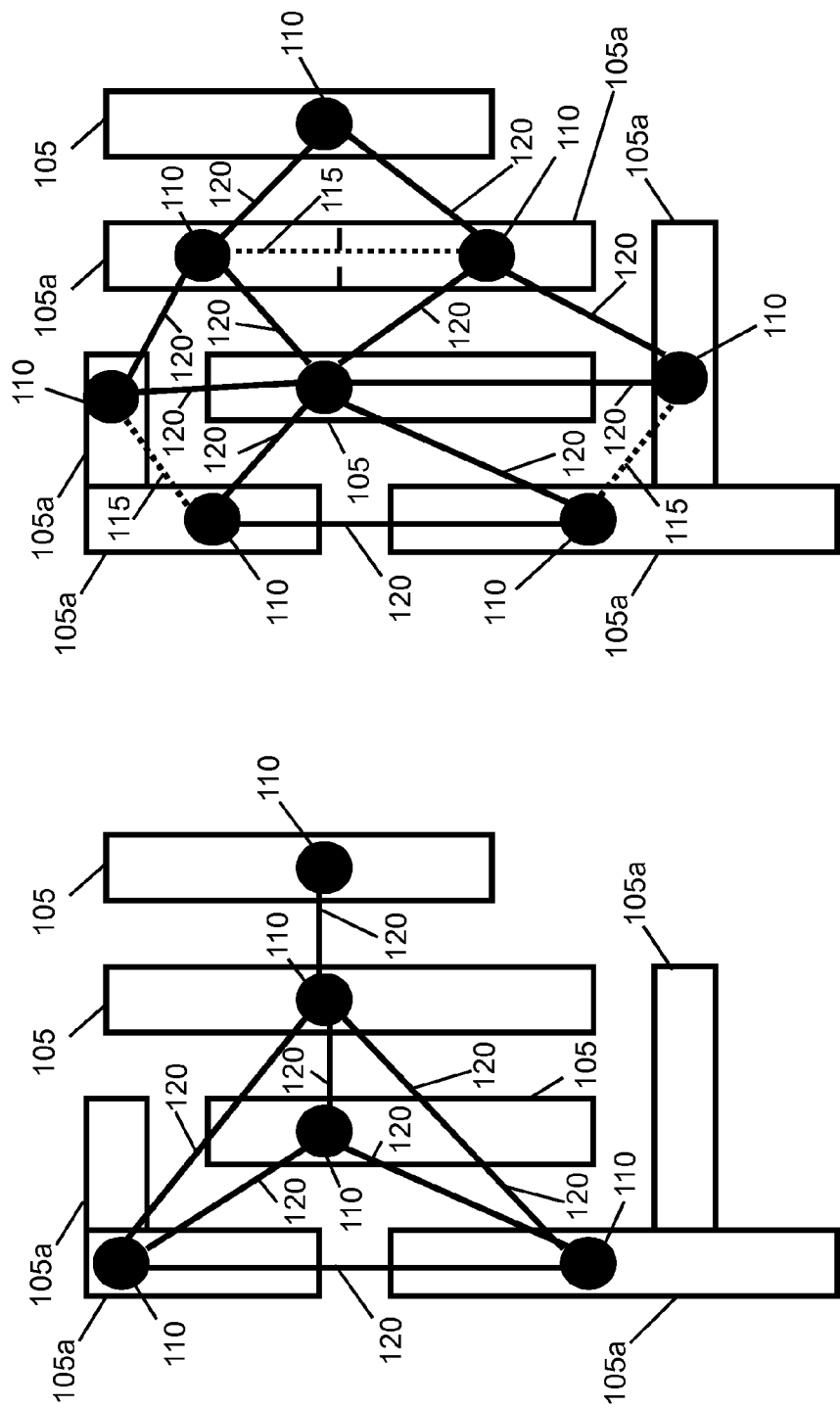
FIG. 1 depicts an example of a triple patterning conflict graph that may be built from a layout.

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the present invention are directed toward techniques for reducing color conflicts in an integrated circuit ("IC") design layout fabricated with triple patterning lithography. Triple patterning lithography generally involves placing shapes that are too close to each other and assigned to the same design layer onto three different mask layers in order to satisfy spacing requirements specified in the layout. These different masks can be used to print one design layer. Embodiments of the present disclosure include a set of restrictive design rules (RDRs) for determining whether some layouts are eligible for color conflict reduction, generating a conflict graph for the layout, and creating a partial or complete color assignment for the conflict graph in cases where the conflict graph is at least partially solvable. Although embodiments of the present disclosure are discussed herein with specific references to triple patterned IC designs, it is understood that the principles discussed herein can be applied to multiple patterning with four or more colors.

Triple patterning layout decomposition can be regarded as a three-coloring problem on a conflict graph. As is known in the art and used hereinafter, a mask layer is often referred to as a "color" and mask layers are referred to as "colors." Thus, in a three-coloring problem, a triple patterning conflict graph can be used to represent the constraints associated with coloring (i.e., masking) shapes that are too close to each other to be assigned the same color onto three colors. In particular, the triple patterning conflict graph represents color conflicts (i.e., spacing violations) when shapes in the layout are assigned to the same color and separated by less than the minimum distance between two shapes on different mask layers (referred to herein as the "mask layer distance"). Shapes located less than the mask layer distance apart can be shown on the conflict graph as being coupled by a "conflict arc." More specifically, in a triple patterning conflict graph, nodes can represent the features of the shapes to be colored and conflict arcs that couple some of the nodes in the graph can represent the color conflicts that may exist when shapes represented by these nodes are assigned to the same color. Coloring the triple patterning conflict graph in three colors so that there is no edge connecting two nodes in the same color is equivalent to a three-coloring problem that is recognized as an NP-complete problem (i.e., solutions are quickly verified but not efficiently obtainable), and possibly an NP-hard problem (i.e., at least as difficult or inefficient to solve as NP-Complete).

FIG. 1 is an example of a triple patterning conflict graph 100 that may be built from a layout according to one embodiment of the present invention. As shown in FIG. 1, triple patterning conflict graph 100 includes shapes 105 that can take the form of polygonal shapes. Triple patterning conflict graph 100 more specifically depicts part of a metal level layer (e.g., an M1 layer) of a proposed IC layout. For illustrative purposes, shapes 105 are simple polygonal shapes (e.g., a "T" shape, a "straight-line" shape and an "L" shape), and are not meant to limit the various embodiments of the present invention. Each shape 105 in triple patterning conflict graph 100 is represented by a node 110. Some shapes 105 are split into segments 105a so that each can be printed to a different color. In this manner, even though segments 105a are printed in different color overlays, they will print to form the continuous segment from which they are formed. Stitch arcs 115 can be used to represent continuous shapes 105 that are formed from stitched segments 105a.

In FIG. 1, the straight-line shape 105 and the L shape 105 each show segments 105a that are stitched together to form the continuous shape. Note that each segment 105a is represented with a node. Shapes 105 and their accompanying segments 105a that are separated from each other by less than the mask layer distance are represented in triple patterning conflict graph 100 by conflict arcs 120. For example, there is a conflict arc 120 between the T shape 105 and the left-segment of the straight-line shape 105. There is also a conflict arc 120 between the top portion of the L shape 105 and the right-segment of the straight-line shape 105. In addition, there is also a conflict arc 120 between the bottom portion of the L shape 105 and the right-segment of the straight-line shape 105. As a result, each of the shapes 105 and segments 105a must be assigned a different color. In this manner, triple patterning conflict graph 100 can represent a layout and the coloring constraints in a three-color graph. With the layout and coloring constraints converted into a three-color graph such as the one illustrated in FIG. 1, the graph can then be traversed and assigned colors to each node while trying to satisfy the conflict constraints noted in the graph.

Figure 2:
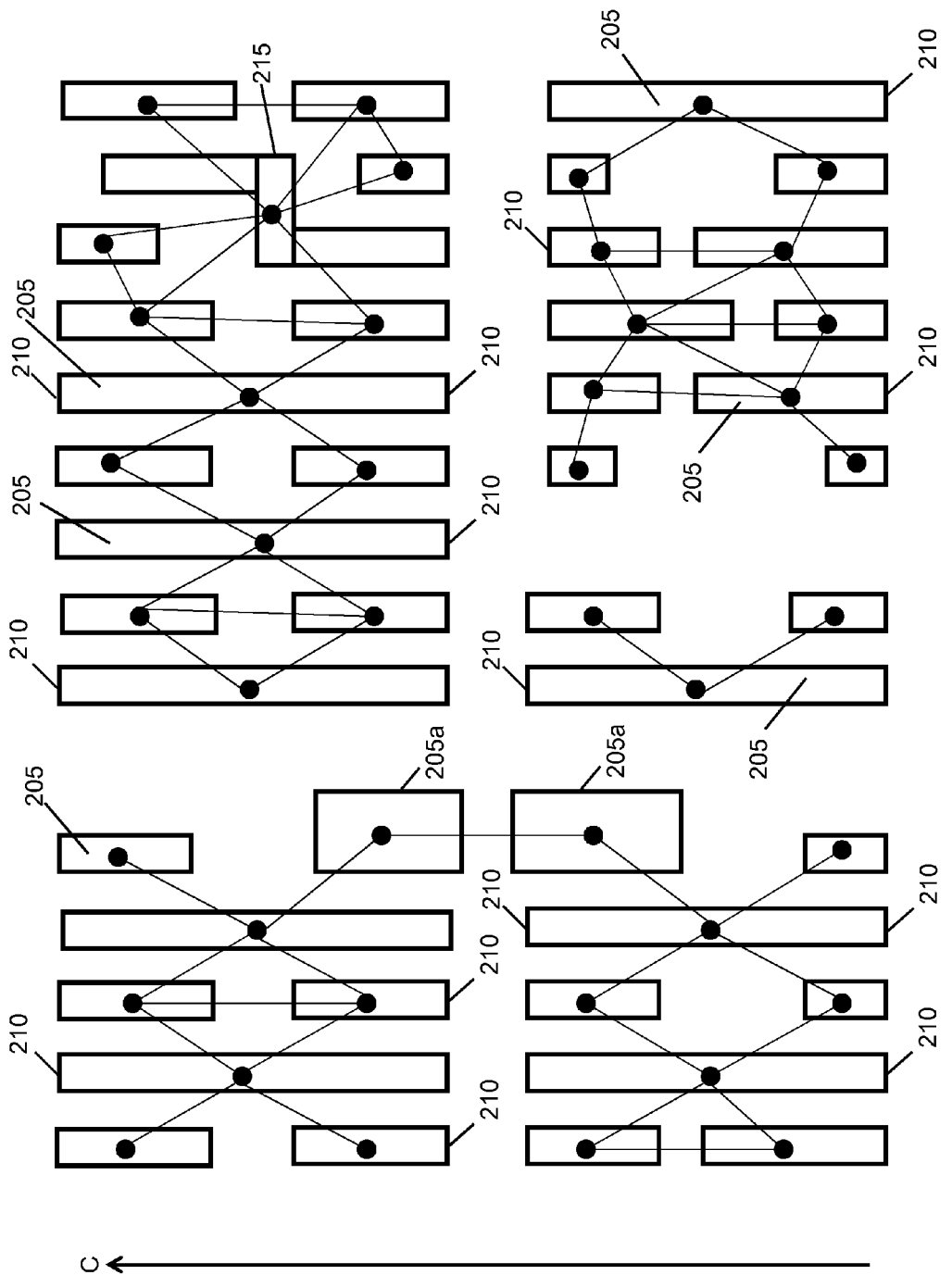
FIG. 2 depicts an example of a triple patterning conflict graph for a local interconnect (CA) layer.

In FIG. 2, another triple patterning conflict graph 200 is shown. Triple patterning conflict graph 200 can depict a local interconnect area (CA) layer of an IC layout. The CA layer of an IC layout can refer to a layer positioned on an outermost area of a substrate which contacts other devices and/or external elements. CA layers may be distinct from a metal level layer in that their shapes are in the form of shape lines 205. Each shape line 205 includes two shape line ends 210 thereon. In the context of CA layers, each shape line 205 can be divided into segments with different colors when the length of shape line 205 exceeds the mask layer distance.

CA layers can be mapped via triple patterning lithography so long as basic design rules are satisfied. In most cases, as is shown in FIG. 2, each shape line 205 is of substantially uniform width, although some shape lines 205a may be permitted to have larger widths to perform particular functions. The spacing between each shape line end 210 can be based on the mask layer distance or a "minimum different color distance." As discussed elsewhere herein, the mask layer distance is a minimum separation between two shape lines 205 assigned to a single color. A "minimum different color distance," however, refers to the minimum separation distance needed particular shape lines 205 assigned different colors. The minimum different color distance is therefore much smaller than the mask layer distance, and these distances can have differing values depending on whether two shape line ends 210 in different rows are being placed next to each other. Each shape line 205 is also in the shape of a rectangle, with the sole exception being a "cross couple" shape 215 used in some CA layouts. The various rectangular shape lines 205 are also oriented substantially along or substantially parallel to a single axis C.

Figure 3:
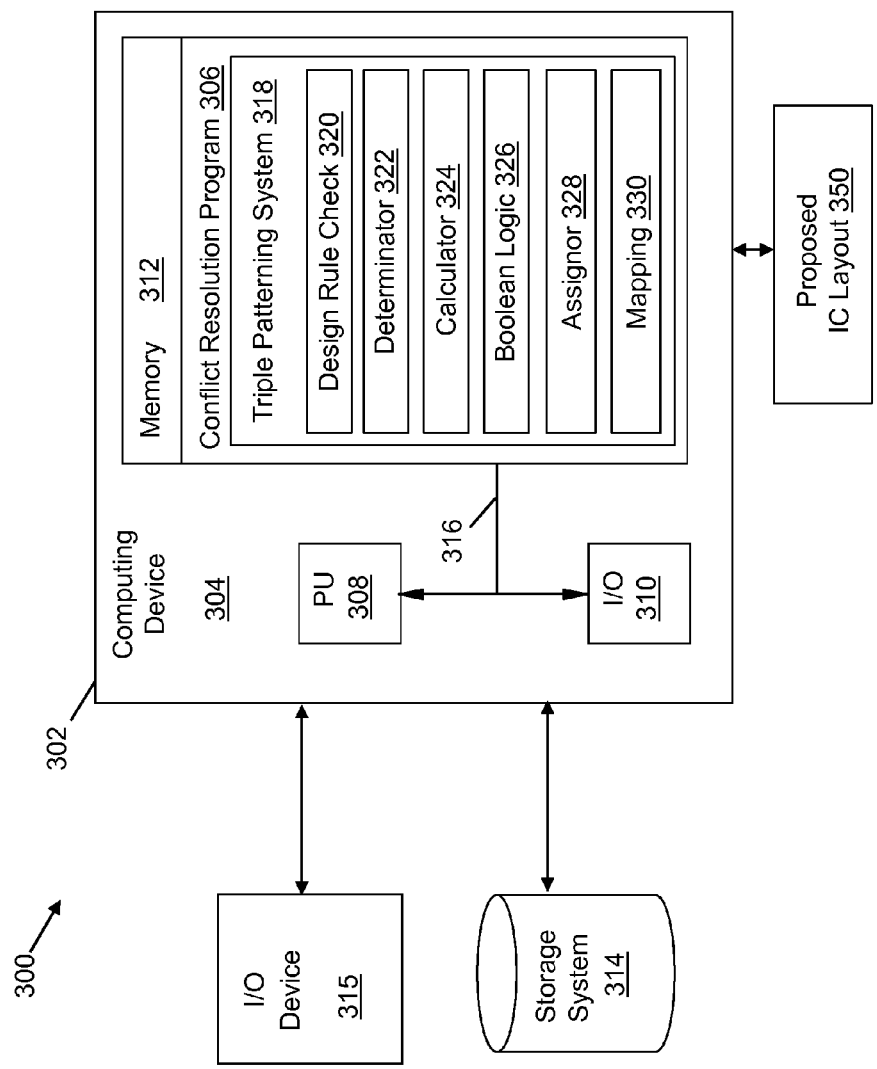
FIG. 3 depicts an illustrative environment which includes a computer system interacting with a proposed IC layout according to an embodiment of the present disclosure.

Turning now to FIG. 3, an illustrative environment 300 for implementing the method and/or system described herein is shown. The method and/or system may be coded as a set of instructions on removable or hard media for use by a general-purpose computer, and thus may, in embodiments, include a computer program product. FIG. 3 is also a schematic block diagram of a general-purpose computer for practicing the present invention. In particular, a computer system 302 is shown as including a computing device 304. Computing device 304 can include a conflict resolution program 306 which can reduce color conflicts in triple patterning lithography by performing any/all of the processes described herein and implementing any/all of the embodiments described herein.

Computer system 302 is shown including a processing unit 308 (e.g., one or more processors), an I/O component 310, a memory 312 (e.g., a storage hierarchy), an external storage system 314, an input/output (I/O) device 315 (e.g., one or more I/O interfaces and/or devices), and a communications pathway 316. In general, processing unit 308 can execute program code, such as conflict resolution program 306, which is at least partially fixed in memory 312. While executing program code, processing unit 308 can process data, which can result in reading and/or writing transformed data from/to memory 312 and/or I/O device 315 for further processing. Pathway 316 provides a communications link between each of the components in environment 300. I/O component 310 can comprise one or more human I/O devices, which enable a human user to interact with computer system 302 and/or one or more communications devices to enable a system user to communicate with the computer system 302 using any type of communications link. To this extent, conflict resolution program 306 can manage a set of interfaces (e.g., graphical user interface(s), application program interface(s), etc.) that enable human and/or system users to interact with conflict resolution program 306. Further, conflict resolution program 306 can manage (e.g., store, retrieve, create, manipulate, organize, present, etc.) data, through several modules contained within a triple patterning system 318.

In any event, computer system 302 can comprise one or more general purpose computing articles of manufacture (e.g., computing devices 304) capable of executing program code, such as conflict resolution program 306, installed thereon. As used herein, it is understood that "program code" means any collection of instructions, in any language, code, or notation, that cause a computing device having an information processing capability to perform a particular function either directly or after any combination of the following: (a) conversion to another language, code or notation; (b) reproduction in a different material form; and/or (c) decompression. To this extent, conflict resolution program 306 can be embodied as any combination of system software and/or application software.

Further, conflict resolution program 306 can include a triple patterning system 318. In this case, various modules of triple patterning system 318 can enable computer system 302 to perform a set of tasks used by conflict resolution program 306, and can be separately developed and/or implemented apart from other portions of conflict resolution program 306. As used herein, the term "component" means any configuration of hardware, with or without software, which implements the functionality described in conjunction therewith using any solution, while the term "module" means program code that enables computer system 302 to implement the functionality described in conjunction therewith using any solution. When fixed in memory 312 of computing device 304 which includes processing unit 308, a module is a substantial portion of a component that implements the functionality. Regardless, it is understood that two or more components, modules, and/or systems may share some/all of their respective hardware and/or software. Further, it is understood that some of the functionality discussed herein may not be implemented or additional functionality may be included as part of computing device 304.

Several modules of triple patterning system 318 are shown in FIG. 3 by way of example. A design rule check (DRC) module 320 can compare the characteristics of an IC layout with particular rules, including basic rules and additional "Restrictive Design Rules" (RDRs) preset in triple patterning system 318 or issued to computer system 302 from a user, e.g., with I/O device 315. A determinator module 322 can issue instructions, commands, etc. based on data stored within memory 312 of computing device 304, or other pieces of information provided thereto. A calculator module 324 can perform mathematical computations, a Boolean logic module 326 can convert conflict graphs of integrated circuit nodes into Boolean logic expressions and/or perform logic algorithms, and an assignor module 328 can assign colors to nodes of an IC layout based on determinations of triple patterning system 318 and/or Boolean logic module 326. Mapping module 330 can generate a conflict graph of IC layouts which qualify for color conflict reduction. Each module discussed herein can obtain and/or operate on data from exterior components, units, systems, etc., or from memory 312 of computing device 304. Triple patterning system 318 of conflict resolution program 306 can reduce color conflicts for a proposed IC layout 350. Proposed IC layout 350 can be converted into data and may be stored, e.g., within memory 312 of computing device 304, storage system 314, and/or any other type of data cache in communication with computing device 304. The features of proposed IC layout 350 (e.g., arrangements of nodes and/or shape lines) can be converted into data for conflict resolution program 306 by use of scanning devices and/or manual entry of a user.

Where computer system 302 comprises multiple computing devices, each computing device may have only a portion of conflict resolution program 306 and/or triple patterning system 318 fixed thereon (e.g., one or more modules). However, it is understood that computer system 302 and conflict resolution program 306 are only representative of various possible equivalent computer systems that may perform a process described herein. To this extent, in other embodiments, the functionality provided by computer system 302 and conflict resolution program 306 can be at least partially implemented by one or more computing devices that include any combination of general and/or specific purpose hardware with or without program code. In each embodiment, the hardware and program code, if included, can be created using standard engineering and programming techniques, respectively.

Regardless, when computer system 302 includes multiple computing devices, the computing devices can communicate over any type of communications link. Further, while performing a process described herein, computer system 302 can communicate with one or more other computer systems using any type of communications link. In either case, the communications link can comprise any combination of various types of wired and/or wireless links; comprise any combination of one or more types of networks; and/or use any combination of various types of transmission techniques and protocols. Computer system 302 can obtain or provide data, such as data stored in memory 312 or storage system 314, using any solution. For example, computer system 302 can generate and/or be used to generate data from one or more data stores, receive data from another system, send data to another system, etc.

While shown and described herein as a method and system for reducing color conflicts in triple patterning lithography, it is understood that aspects of the invention further provide various alternative embodiments. For example, in one embodiment, the invention provides a computer program fixed in at least one computer-readable medium, which when executed, enables the management and resolution of at least some color conflicts in triple patterned designs. To this extent, the computer-readable medium includes program code, such as conflict resolution program 306, which implements some or all of the processes and/or embodiments described herein. It is understood that the term "computer-readable medium" comprises one or more of any type of tangible medium of expression, now known or later developed, from which a copy of the program code can be perceived, reproduced, or otherwise communicated by a computing device. For example, the computer-readable medium can comprise: one or more portable storage articles of manufacture; one or more memory/storage components of a computing device; paper; etc.

In another embodiment, the invention provides a method of providing a copy of program code, such as conflict resolution program 306, which implements some or all of the processes described herein. In this case, a computer system can process a copy of program code that implements some or all of the processes described herein to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a system for reducing color conflicts in multiple patterned designs, including triple patterned designs. In this case, a computer system, such as computer system 302, can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; etc.

Figure 4:
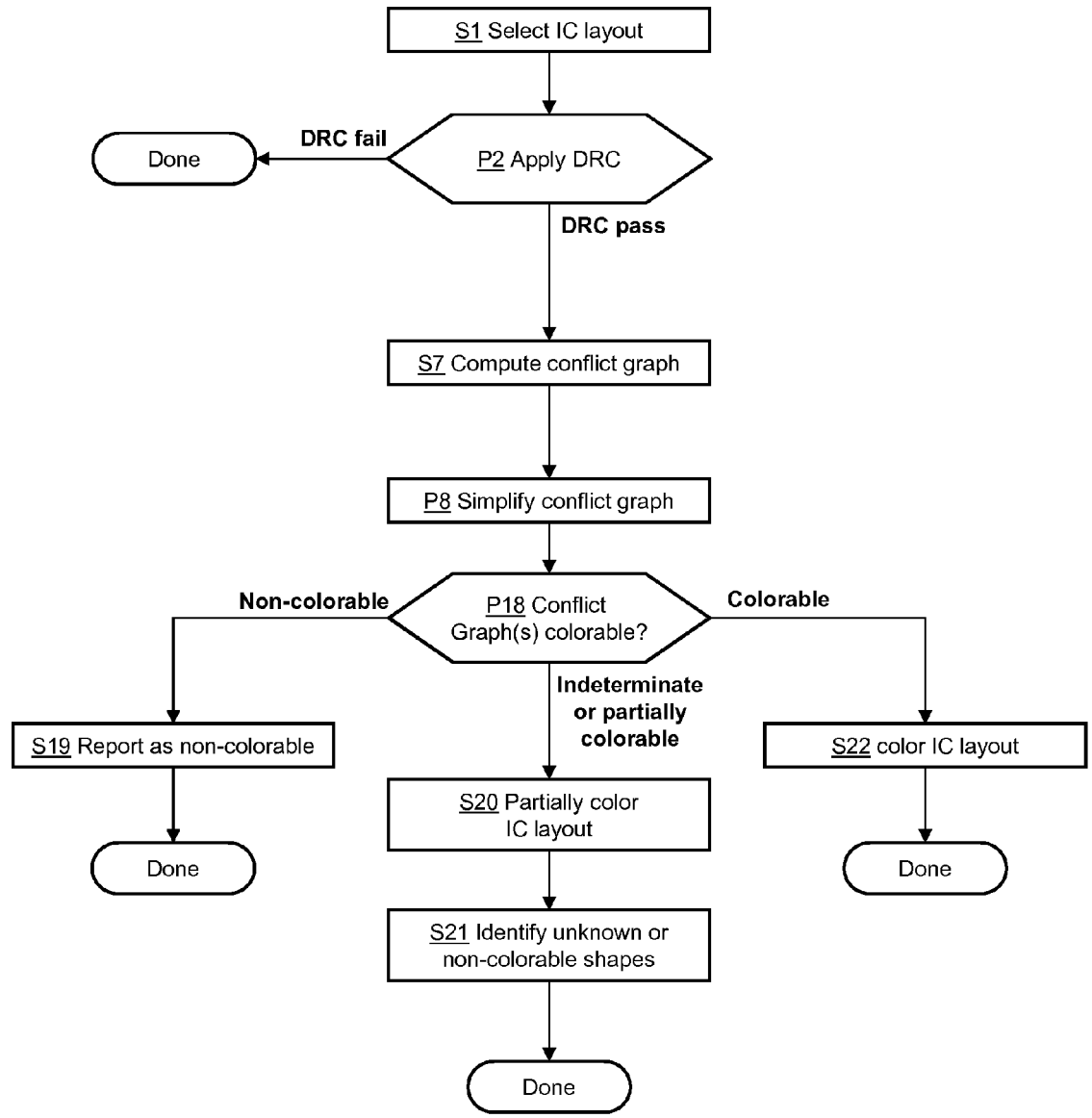
FIGS. 4-5 depict flow diagrams with illustrative method steps according to embodiments of the present disclosure.

Referring to FIG. 4 in conjunction with FIG. 3, a process flow diagram of methods according to the present disclosure is shown. The process flow diagram of FIG. 4 provides an overview of various method steps and processes, some of which are shown in greater detail in other FIGURES and described elsewhere herein. The steps and processes can each be carried out with the components shown in FIG. 3 and described herein by example.

In step S1, conflict resolution program 306 of computer system 302 can select data for an IC layout, e.g., proposed IC layout 350. The IC layout obtained in step S1 can correspond to one or more layers of an IC structure, such as a CA layer, one or more metal level layers (e.g., M1), etc. Methods according to the present disclosure generally operate on triple patterned IC layouts and can reduce or eliminate the presence of two nodes assigned with the same color and separated by less than the mask layer distance. After selecting a particular IC layout in step S1, methods of the present disclosure can apply a "design rule check" (DRC) on the selected layout in process P2.

Figure 5:
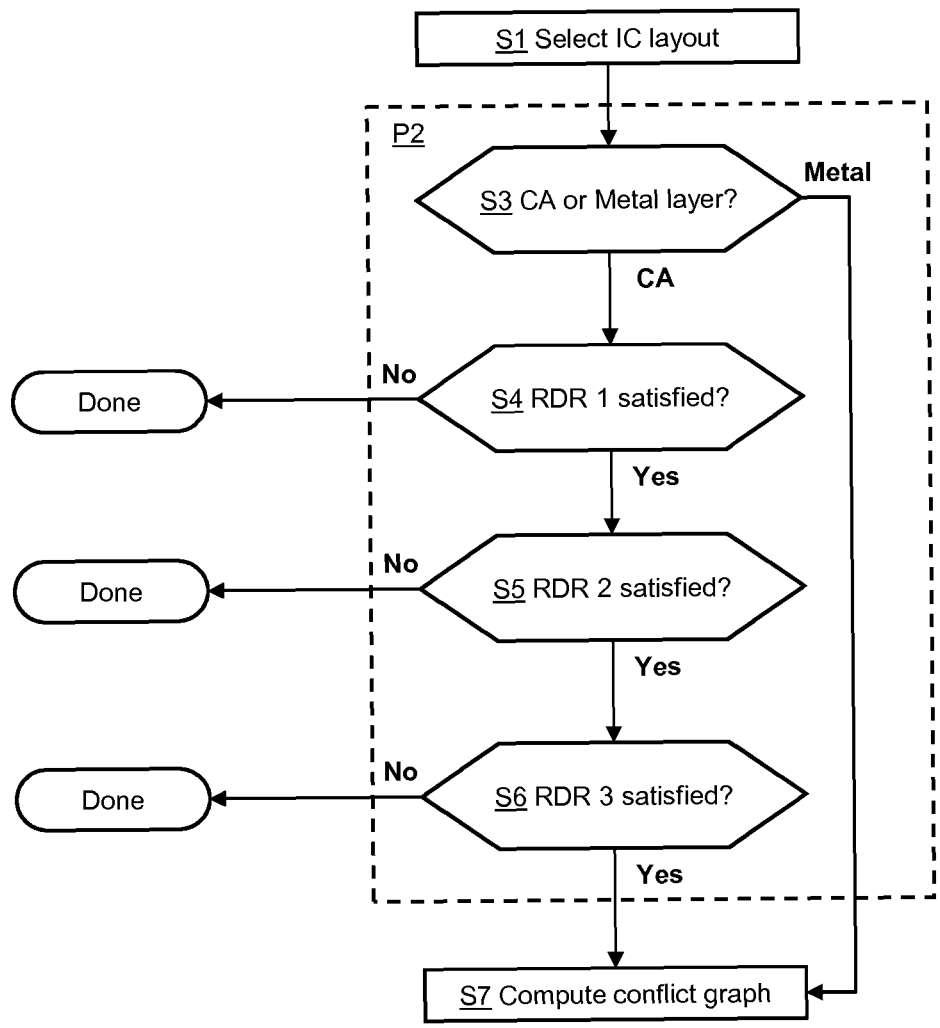

A method of applying DRC 320 in process P2 according to the present disclosure is shown in FIG. 5, and the steps shown therein are explained by reference to FIG. 3 and FIG. 5. Methods of the present disclosure can reduce or eliminate color conflicts in a mapped IC layout for either a metal level layer (e.g., M1) or a CA layer of an IC device. Although metal level and CA layers are discussed herein by way of example, it is understood that the techniques discussed herein can be adapted to other layers or structures of an IC device. In step S3, determinator 322 can determine whether proposed IC layout 350 is a metal level layer or a CA layer by reference to user instructions and/or the characteristics of proposed IC layout 350. Determinator 322 can identify a CA layer by some or all of the IC layout characteristics discussed herein, e.g., each shape being in the form of a shape line oriented substantially in the same direction and having substantially equal widths. Proposed IC layout 350 being a metal layer can cause triple patterning system 318 to proceed immediately to computing a conflict graph for proposed IC layout 350. Proposed IC layout 350 being a CA layer can cause DRC 320 to apply a set of "restrictive design rules" (RDRs) to examine whether proposed IC layout 350 is a candidate for color conflict reduction.

Figure 6:
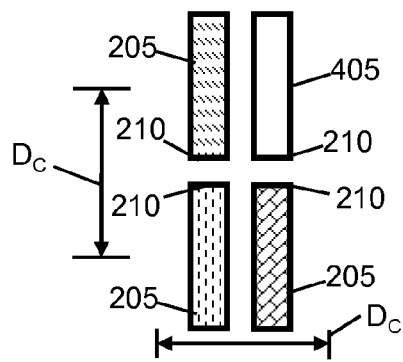
FIGS. 6-8 depict forbidden CA layer arrangements in Restrictive Design Rules (RDRs) according to an embodiment of the present disclosure.

Turning to FIGS. 5 and 6, DRC 320 (FIG. 3) can forbid two opposing pairs of shape line ends 210 from being positioned less than the minimum different color distance $D_C$ apart (RDR 1) in step S4. Different colored shape lines 205 are represented in FIG. 6 with different textures. As discussed herein minimum different color distance $D_C$ can represent the minimum possible difference between two shapes assigned to different colors. Thus, a CA layer which includes a pattern such as that shown in FIG. 6 would not be a candidate for color conflict reduction because an uncolorable shape line 405 is present in the layout. DRC 320 will proceed to further steps when the proposed layout satisfies this design rule of step S4.

Figure 7:
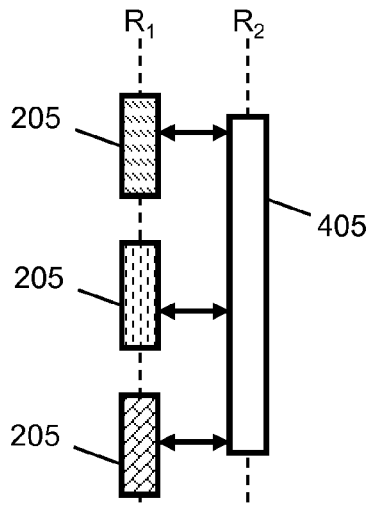

Turning to FIG. 7 in conjunction with FIG. 5, DRC 320 (FIG. 3) in step S5 can also forbid each CA shape line 205 from being at less than the mask layer distance from more than two shapes in a particular adjacent row (RDR 2). A forbidden arrangement is shown in FIG. 7 with different colored shape lines 205 being represented with different textures. A first row $R_1$ is shown to have three shape lines 205 each adjacent to a single uncolorable shape line 405 in a second row $R_2$. Uncolorable shape line 405 cannot be assigned a non-conflicting color in this arrangement because it is already adjacent to three nodes in the same row which are less than the mask layer distance away. In contrast, uncolorable shape line 405 would be colorable if one shape line 205 were removed from $R_1$ even if uncolorable shape line 405 is coupled to other shape lines in $R_2$ or another adjacent row (not shown), or if the separation between lines $R_1$ and $R_2$ were greater than the mask layer distance. DRC 320 (FIG. 4) will therefore exclude a CA layout from color conflict reduction if a single shape line is coupled to more than two other shape lines in an adjacent row.

Figure 8:
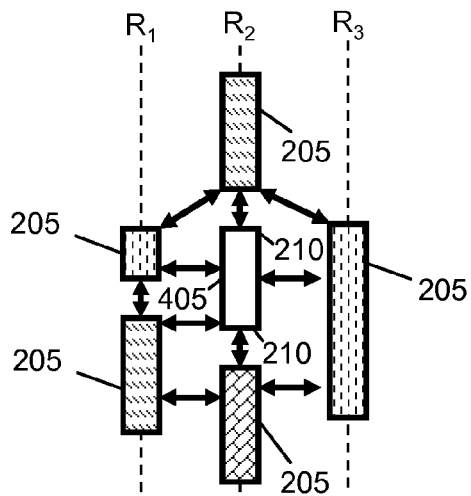

Turning now to FIGS. 5 and 8, DRC 320 (FIG. 3) in step S6 can forbid two pairs of opposing ends of each shape line 205 from being at less than the mask layer distance from an adjacent shape (RDR 3) in step S6. In FIG. 8, an uncolorable shape line 405 is separated from adjacent shape lines 205 by less than the mask layer distance at two pairs of opposing ends. Again, different colored shape lines 205 are represented in FIG. 8 with different textures. This configuration prevents uncolorable shape line 405 from being colored in triple patterning lithography because the two pairs of opposing ends being separated from adjacent shapes by less than the mask layer distance would always require a fourth color. Removing one shape line 205 from being adjacent to uncolorable shape line 405 in line $R_2$ or removing one adjacent node line 205 from $R_1$ or $R_3$ (or increasing the distance between these node lines to more than the mask layer distance) would resolve this color conflict. Thus, shape lines 205 separated from adjacent shape lines 205 by less than the mask layer distance at two opposing ends are not candidates for color conflict reduction and will fail step S6.

Returning to FIGS. 3 and 5 together, mapping module 330 of triple patterning system 318 can compute a conflict graph for proposed IC layout 350 in step S7. Proposed IC layouts which include a CA layer which passes the RDRs applied in steps S4-S6 or a metal level layer are eligible for color conflict reduction according to embodiments of the present disclosure. In some cases, a user may override a determination that a CA layout is ineligible for not satisfying the RDRs described herein, e.g., by command to conflict resolution program 306 through I/O device 315, allowing failed ineligible layouts to be at least partially colored in a conflict graph according to the present disclosure. The conflict graph computed in step S7 can be in a form similar to FIG. 1 and FIG. 2, depending on whether proposed IC layout 350 is a metal level layer or a CA layer, and each node or shape line in the conflict graph can be assigned a different color. As triple patterning lithography forbids any node from being adjacent another node of the same color when the two nodes are within the mask layer distance, the generated conflict graph provides a visual indication of coloring, and is a starting point for determining whether the proposed layout can be colored successfully.

To determine whether the conflict graph generated in step S7 is fully or partially colorable, other method steps can apply simplification and problem solving techniques (discussed elsewhere herein) to reduce or eliminate color conflicts. Returning to FIG. 4, methods of the present disclosure can optionally include simplifying the generated conflict graph in process P8. Conflict graphs for an IC layout can be simplified by any single or combined simplification method, with example simplification methods being discussed herein.

Figure 9:
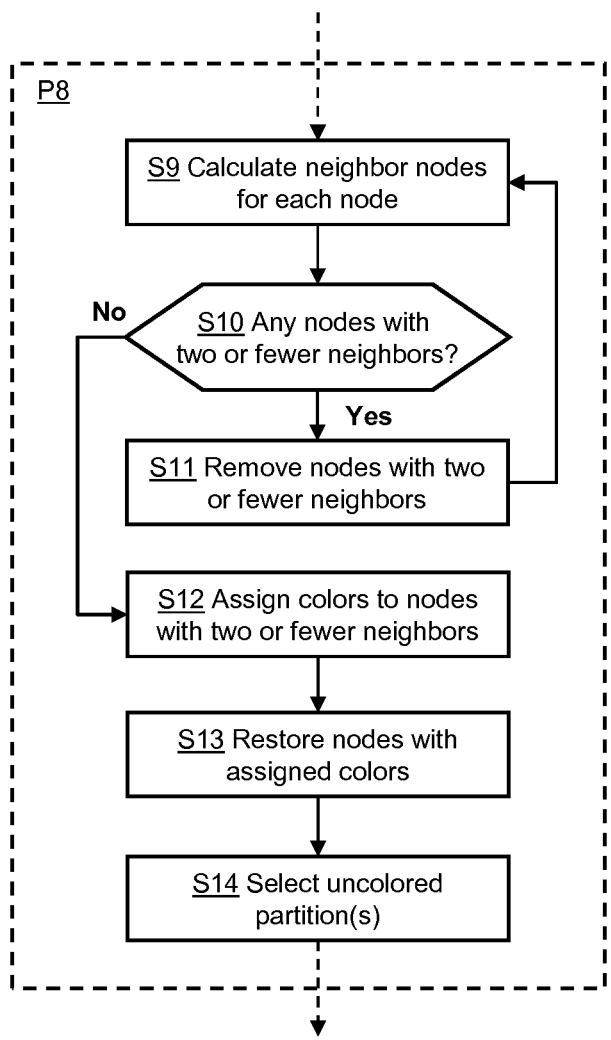
FIGS. 9-15 depict flow diagrams with illustrative method steps according to embodiments of the present disclosure.

Referring to FIGS. 3 and 9 together, method steps for simplifying the generated conflict graph in process P8 are shown. Calculator 324 can calculate the number of neighbor nodes for each node in the conflict graph in step S9. The term "neighbor node" can refer to a node separated from the node being examined by less than the mask layer distance. The node being examined and its neighbor nodes must be assigned non-conflicting colors.

In step S10, determinator 322 can determine whether any nodes in the conflict graph have two or fewer neighbor nodes. Conflict graphs containing nodes with two or fewer neighbor nodes can be removed and colored to simplify the conflict graph, as these nodes cannot create a color conflict. The verb "remove" in the context of the present disclosure does not refer to physically removing shapes or shape lines from proposed IC layout 350, but rather describes disregarding or ignoring a particular node when performing further simplification and/or coloring operations on a conflict graph. If further simplification is possible after some nodes are removed, the method can return to step S9 to again calculate neighbor nodes for each remaining node in the conflict graph.

In step S12, assignor 328 can assign colors to each of the nodes which were previously removed from the conflict graph (step S10). In step S12, mapping module 330 can assign colors to these removed nodes in the reverse order from when they were originally removed from the conflict graph. Assigning colors to removed nodes in the reverse order of their removal allows nodes that are adjacent to potentially conflicting nodes to receive color assignments before moving to nodes which will not create a color conflict. Thus, assigning colors to some nodes from the conflict graph in step S12 can simplify color conflict reduction of other nodes in the conflict graph. After colors are assigned to the removed nodes, mapping module 330 can restore these removed and colored nodes to the conflict graph in step S13.

After the coloring and restoring processes of S12 and S13, the conflict graph for proposed IC layout 350 may now be composed of several "partitions." Each "partition" can essentially be subsections or sub-maps of the generated conflict graph. Where each partition of the original conflict graph is isolated from one or more other partitions or sections, each uncolored partition can be treated as an independent coloring problem to be solved. Thus, determinator 322 can select one or more uncolored partitions in step S14 to be colored according to the present disclosure. The remaining steps of determining whether an uncolored partition is colorable, partially colorable, non-colorable, or indeterminate can by performed separately, and/or substantially simultaneously with the simplification steps in any embodiment of process P8 and discussed herein.

Figure 10:
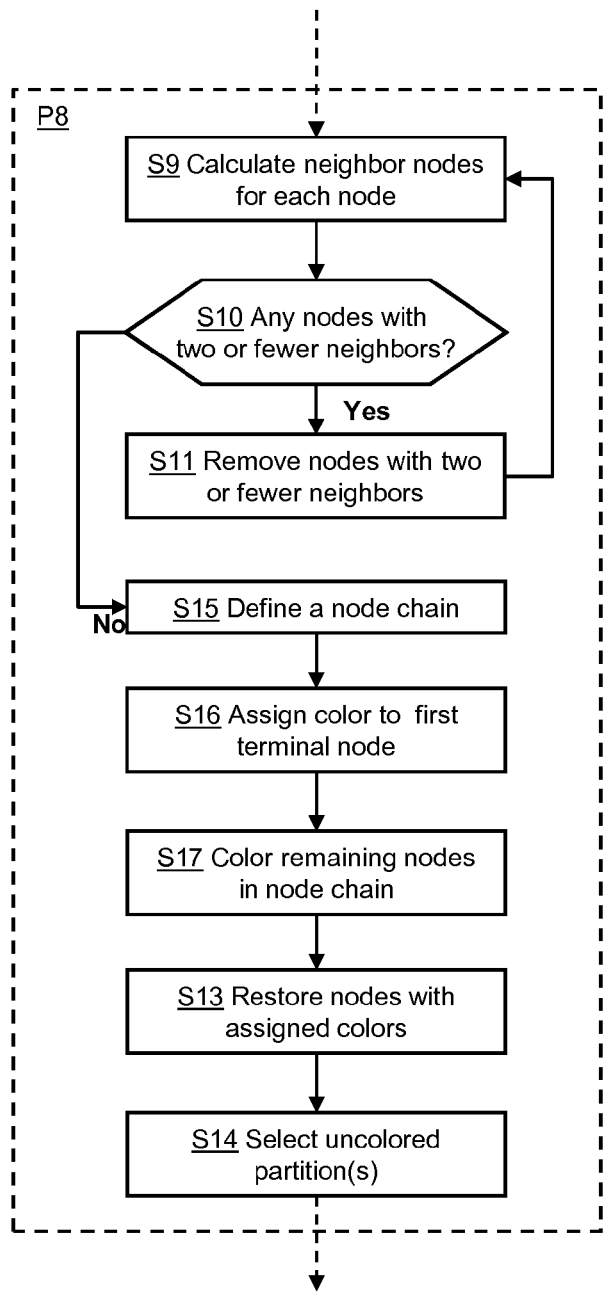

Referring to FIGS. 3 and 10, an alternative embodiment of process P8 for simplifying the conflict graph is shown. Process P8 can begin with calculator 324 calculating the number of neighbor nodes for each node in step S9, determinator 322 determining whether any of the nodes have two or fewer neighbors in step S10, and mapping module 330 removing nodes with two or fewer neighbors in step S11. Where all nodes with two or fewer neighbors have been, mapping module 330 can define one or more "node chains" in step S15. A node chain can include a first terminal node which has exactly two neighbor nodes, and a second terminal node which has at most two uncolored neighbor nodes. The remaining nodes of the node chain link the two neighbor nodes, thereby forming a chain between the first terminal node and the second terminal node. Defining one or more "node chains" with mapping module 330 can allow a large number of nodes arranged in a simple formation to be colored at once. In step S16, assignor 328 can assign a color to the first terminal node of the node chain. Assignor 328 can then assign colors to the remaining nodes of the node chain in step S17 based on the coloring of the first terminal node and/or other nodes of the chain. In step S13, mapping module 330 can restore the colored node chain(s) to the conflict graph. Process P8 can define and color several node chains in succession or simultaneously to further simplify the conflict graph. As discussed with respect to FIG. 9, mapping module 330 can divide proposed IC layout 350 into simplified, uncolored partitions which can be solved independently, and one uncolored partition can be selected in step S14.

Figure 11:
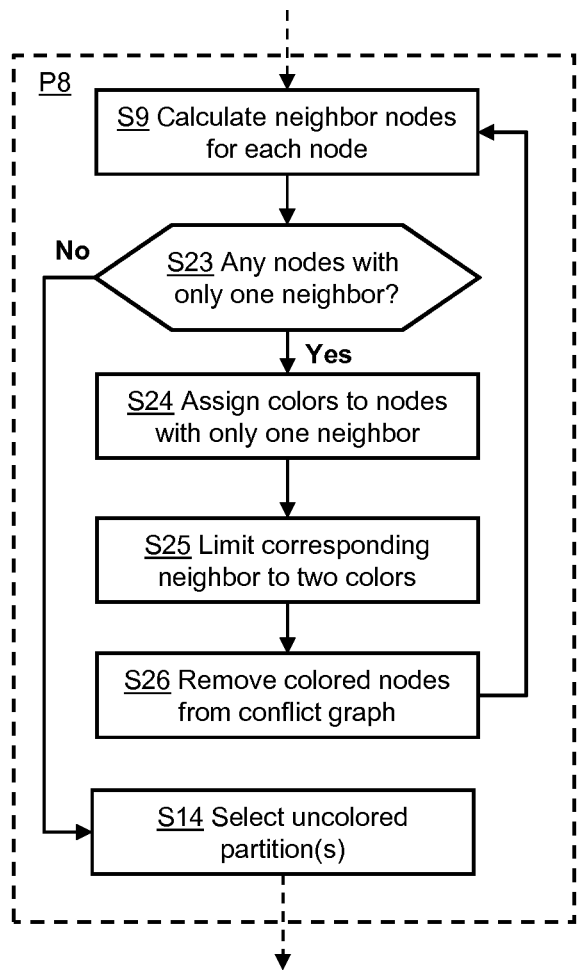

Referring to FIGS. 3 and 11, process P8 of simplifying the conflict graph can additionally or alternatively include simplifying the conflict graph by removing nodes with only one neighbor. In step S9, calculator 324 can calculate the number of neighbor nodes for each node during process P8, and in step S23 determinator 322 can determine which of the nodes are have only one neighbor node. In step S24, assignor 328 can pre-assign a color to each node with at most one neighbor node. In step S25, Boolean logic module 326 can correspondingly limit any corresponding neighbor nodes to the two remaining colors, e.g., by altering the Boolean logic expression for the conflict graph. Mapping module 330 can then remove the nodes with only one neighbor and assigned to colors from the conflict graph in step S26. This simplification can occur as an additional or alternative process for simplifying the conflict graph in process P8.

Returning to FIGS. 3 and 4, triple patterning system 318 can determine in process P18 whether the simplified conflict graph or partitions thereof are non-colorable, indeterminate, partially colorable, or fully colorable in process P18. Process P18 can be accomplished in several ways according to embodiments of the present disclosure, and illustrative methods for carrying out process P18 are discussed elsewhere herein and shown by example in FIGS. 12-14. To carry out process P18 on a simple conflict graph or sub-graph, mapping component 330 can convert the conflict graph into a Boolean logic expression, e.g., a three-color conjunctive normal form (CNF), a four-color CNF, a "reduced three-color" conjunctive normal form, or another type of logic expression. For the purposes of explanation, the details of CNF in the context of multiple patterned designs are discussed herein. In CNF, one Boolean variable is set out per color, and per node in the conflict graph. An example, expressed in terms of Boolean algebra for limiting each node to one color, for three-color CNF can include the following four-clause expression for each node:

$$\text{Node}C3_i = (!r_i || !b_i) \&\& (!r_i || !g_i) \&\& (!b_i || !g_i) \&\& (r_i || b_i || g_i)$$

A Boolean algebraic expression for color conflicts in a conflict graph limited to three colors can include the following three-clause expression for each node within the mask layer distance from another node:

$$\text{Edge}C3_{i,j} = (!r_i || !r_j) \&\& (!b_i || !b_j) \&\& (!g_i || !g_j)$$

To solve a CNF expression where "XCCNF" represents conjunctive normal form with "X" number of colors, the complete Boolean algebraic expression can be written as:

$$X\text{CCNF} = (\text{For Every Node } i \ \&\& \ \text{Node}CXi) \&\& (\text{For Every Edge } i,j \ \&\& \ \text{Edge}CXij)$$

When the solution to XCCNF is "true," then a color variable for each node will also be true and therefore determine the color assignment. Thus, the size of the problem is proportionate to the size of the conflict graph and the number of nodes separated by less than them ask layer distance. In addition, since a conflict graph is represented as a planar space, the size of the problem is related linearly to the number of shapes being colored.

It is understood, however, that one or more processes for simplifying the conflict graph (process P8) can pre-assign colors to one or more nodes of the conflict graph. This pre-assignment of colors, more specifically can occur before executing process P18 to determine whether the conflict graph and/or its uncolored partitions are colorable. In this case, nodes of the conflict graph connected to a pre-colored node with a conflict arc will be limited to one less than the total number of colors (i.e., only two colors for the node triple patterned design). In this situation, the Boolean expression for the particular node and its corresponding conflict arcs can be reduced by one color to limit the number of clauses based on the simplification and pre-assignment of colors.

Simple Boolean logic expressions (e.g., a CNF expression with limited terms) can be analyzed by a user or by Boolean logic module 326 by known or conventional methods or processes for solving Boolean logic expressions. If no logical solution exists, triple patterning system 318 can report in step S19 that the conflict graph cannot be colored at all. Some problem solving techniques will not yield a partial solution for the conflict graph if they are unsuccessful, causing the conflict graph to be reported as non-colorable in step S19. Some CNF expressions may be partially solvable (i.e., colorable) aside from a particular group of nodes. In still other cases, it may be impossible to determine whether a complete solution exists for the conflict graph (i.e., an NP-complete problem). For example, a particular algorithm or problem solving technique may be limited to a certain time or a certain number of iterations, and will simply describe the problem as being not solvable (i.e., indeterminate) if a full solution is not reached within these predetermined constraints. In these cases, assignor 228 can assign colors to the nodes of the IC layout to the extent possible in step S20 while leaving other nodes blank, based on any partial solutions obtained. Determinator 322 can then identify which nodes are non-colorable and/or which parts of the conflict graph are indeterminate. In the event that determinator 322 determines that the conflict graph is colorable, assignor 328 can assign colors to each node in the conflict graph for the IC layout in step S22.

Figure 12:
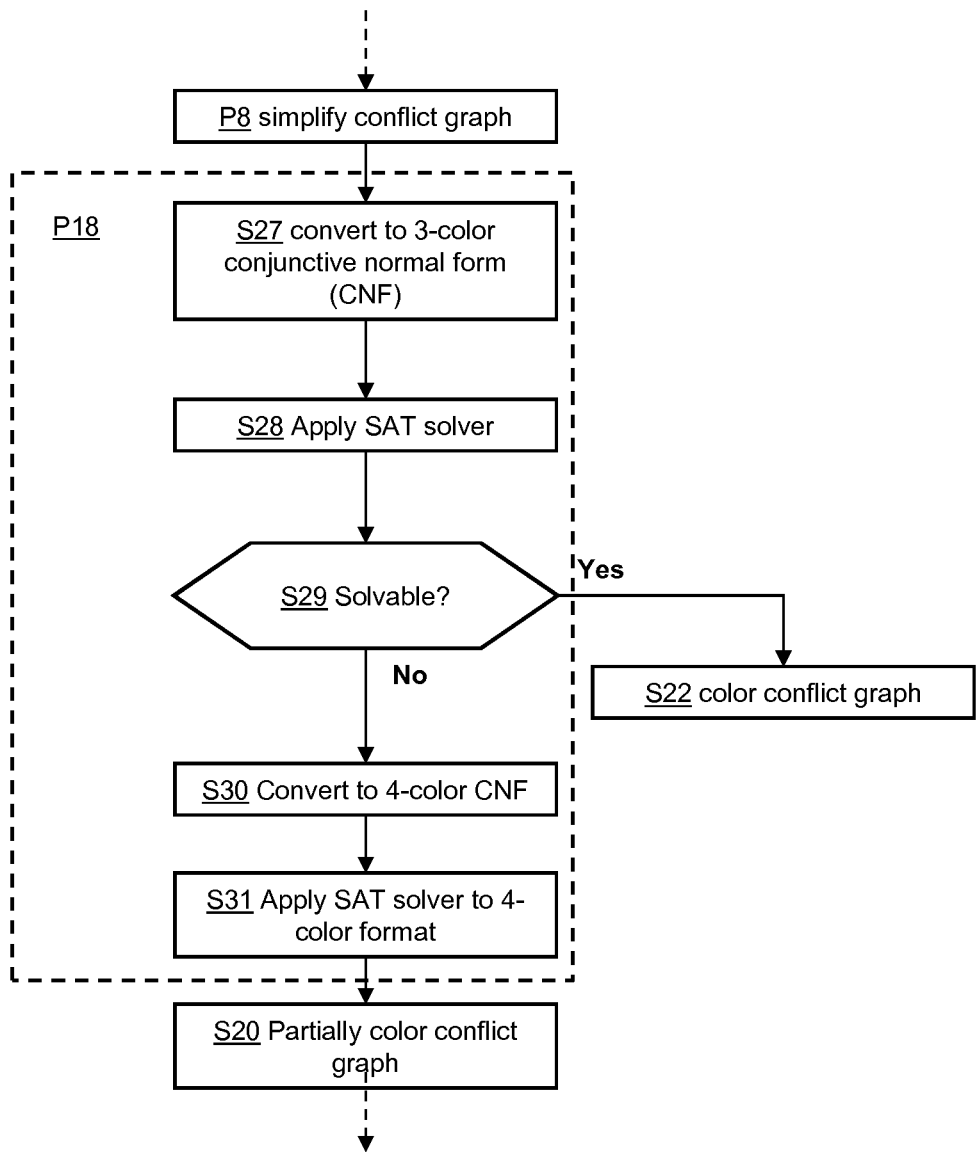

In FIG. 12, an embodiment of process P18 for determining whether proposed IC layout 350 is non-colorable, indeterminate, partially colorable, or fully colorable is shown. Method steps of process P18 are discussed with reference to FIGS. 3 and 11. In step S27, Boolean logic module 326 can convert the simplified conflict graph into 3-color conjunctive normal form (CNF). 3-color CNF generally refers to a type of Boolean logic expression based on the simplified conflict graph which is "true" when colors are successfully assigned to each node of the conflict graph. To determine whether the CNF expression of the conflict graph is solvable, Boolean logic module 326 can apply a Boolean Satisfiability (SAT) solver algorithm to the converted conflict graph in step S28. A "SAT solver algorithm," is an algorithm known in the art of computer science for solving certain Boolean logic expressions. A SAT solver will either identify a Boolean logic expression as solvable, not solvable, or indeterminate, and generally will not provide a partial 3-color solution to indeterminate conflict graphs. In the event that the SAT solver algorithm applied with Boolean logic module 326 determines a solution in step S29, assignor 328 can color proposed IC layout (or a portion thereof on which the SAT solver algorithm is applied) in step S22.

In cases where Boolean logic module 326 is unable to solve the 3-color CNF in step S29, Boolean logic module 326 can reconvert the conflict graph into a 4-color CNF in step S30. The 4-color CNF expression for the conflict graph can be a similar type of Boolean logic expression, except with a fourth color being available. Although triple patterning lithography is limited to three colors, adding a fourth color may act as a shorthand method for identifying where color conflicts exist in proposed IC layout 350. Expressing the conflict graph with 4-color CNF can solve problems not solvable with 3-color CNF. In step S31, Boolean logic module 326 can apply a SAT solver algorithm to the 4-color CNF expression to provide a partial solution to the conflict graph. Assignor 328 can then partially color the IC layout in step S20 based on the 4-color solution. Nodes which would be assigned the fourth color can indicate where remaining color conflicts exist (e.g., non-colorable nodes).

Figure 13:
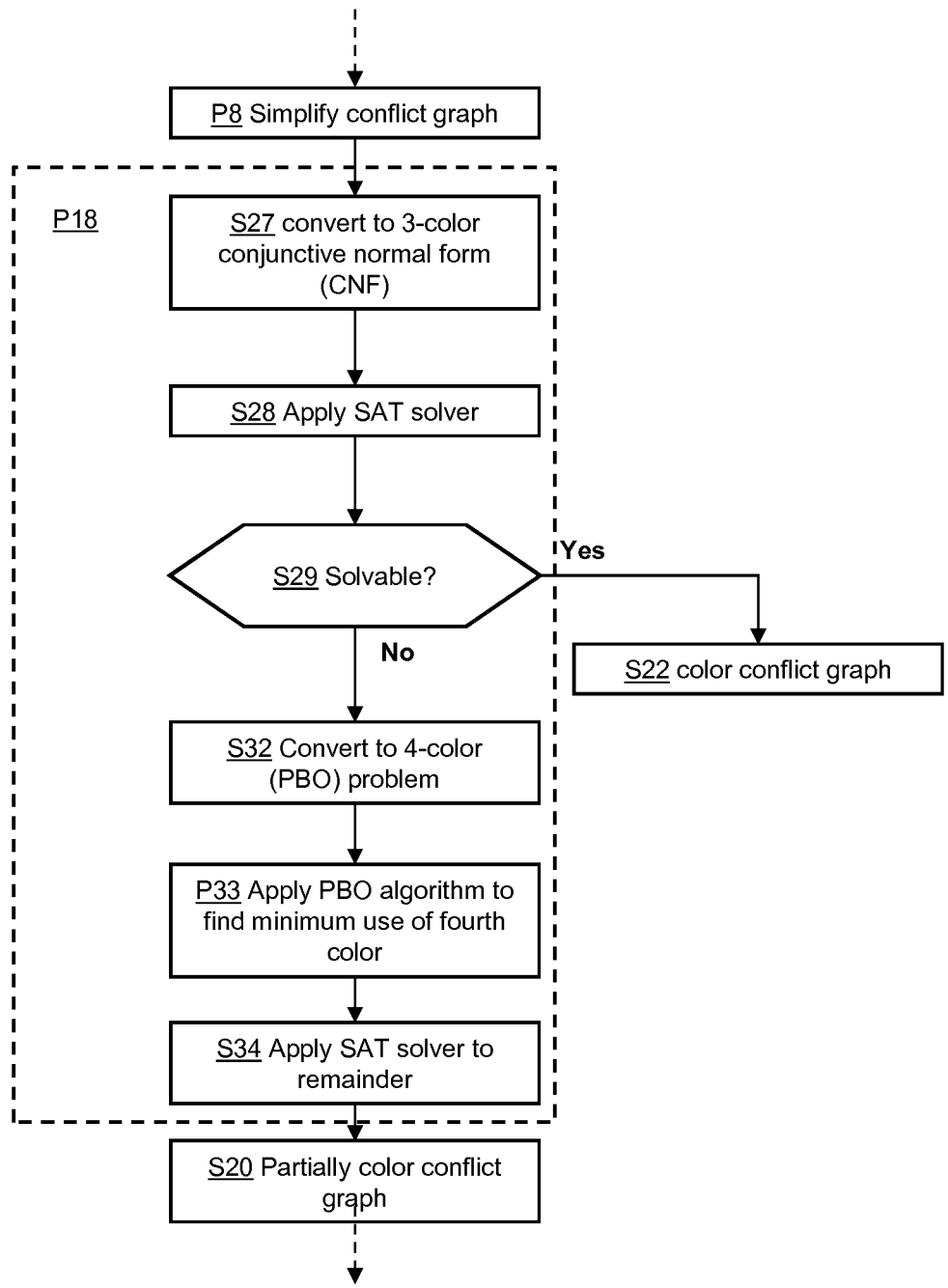

Turning now to FIGS. 3 and 13, an alternative process P18 for determining whether one or more conflict graphs are colorable is shown. After generating a simplified conflict graph in process P8, an alternative version of process P18 can execute steps S27-S29 of converting the conflict graph(s) to 3-color CNF and applying a SAT solver algorithm to the converted expression via Boolean logic module 326. In the event that a conflict graph is not solvable in 3-color conjunctive normal form, Boolean logic module 326 can convert the conflict graph into a 4-color Pseudo-Boolean Optimization (PBO) problem in step S32. A PBO problem is a multi-linear polynomial in the domain of real numbers, converted from a Boolean logic expression. PBO creates an approximation which can be solved via ordinary mathematical techniques. A PBO expression differs from an ordinary 4-color CNF expression to be solved in that algorithms designed for PBO can minimize the use of a fourth color in finding and generating a solution. Thus, in step S33, a PBO algorithm can determine the minimum use of the fourth color in a proposed solution. Afterwards, Boolean logic module 328 can remove the nodes assigned to the fourth color and apply the initial 3-color SAT solver algorithm to the rest of the conflict map to determine colors for non-conflicting nodes. Assignor module 328 can then partially color the resulting IC layout in step S20.

Figure 14:
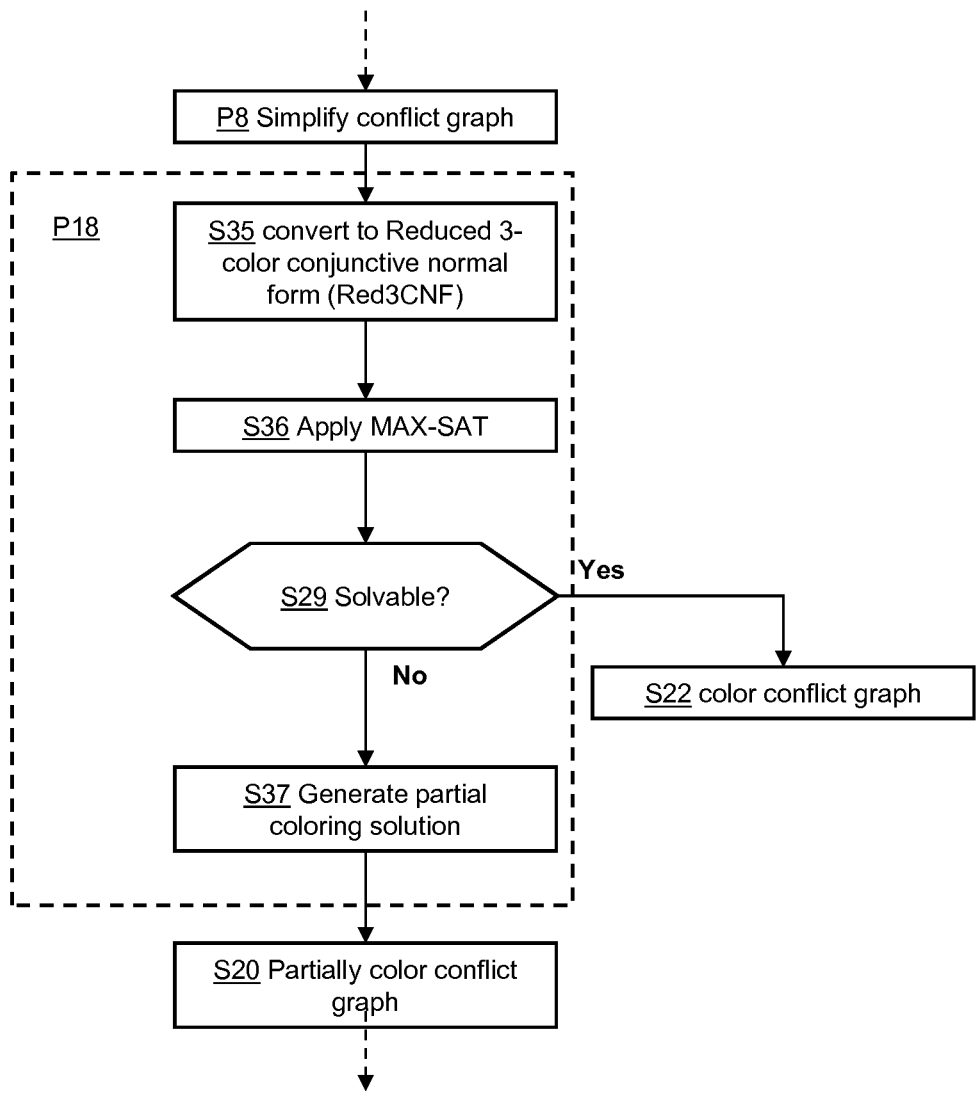

Referring to FIGS. 3 and 14, another embodiment of process P18 for determining whether the conflict graph and/or its partitions are colorable is shown. In step S35, Boolean logic module 326 can convert the conflict graph(s) to reduced 3-color conjunctive normal form (Red3CNF). Red3CNF is similar to ordinary 3-color CNF, but with additional constraints on the number of variables and clauses. In Red3CNF, At least one color must be included in each node clause in the CNF expression, and the CNF expression must continue to include clauses which forbid color conflicts between two adjacent nodes within the mask layer distance of each other. To illustrate this reduced ("Red") form in terms of Boolean algebra, the Boolean expression for coloring each node can be:

$$\text{RedNode}C3_i = (r_i \| b_i \| g_i)$$

The Boolean algebraic expression for color conflict clauses can continue to be expressed as, e.g.:

$$\text{Edge}C3_{i,j} = (!r_i \| !r_j) \&\& (!b_i \| !b_j) \&\& (!g_i \| !g_j)$$

The final Boolean algebraic expression for the conflict graph in Red3CNF can thus be expressed as:

$$\text{Red3CCNF} = (\text{For Every Node } i \&\& \text{Node}C3i) \&\& (\text{For Every Edge } i,j \&\& \text{Edge}C3ij)$$

The converted Red3CNF version of the conflict graph can be used with a more particular Boolean logic algorithm known as a maximum satisfiability problem (MAX-SAT) algorithm. A MAX-SAT algorithm is a generalized version of a SAT solver algorithm for determining the maximum number of clauses in a Boolean expression that can be true after inputting particular values of each Boolean variable. In step S36, Boolean logic module 326 can apply MAX-SAT to the Red3CNF version of the conflict graph to produce a complete solution or a partial solution. For complete solutions, assignor 328 can assign colors to each node in the conflict graph. One advantage to MAX-SAT is that the algorithm will produce a partial solution for the Red3CNF conflict graph even when the problem is indeterminate or not completely solvable. In step S37, Boolean logic module 326 can generate a partial coloring to the extent possible based on the MAX-SAT result. In step S20, assignor 328 can partially color the conflict graph while leaving out non-colorable nodes. The conflict graph can then be reorganized, redesigned, etc. to eliminate the identified color conflicts where applicable.

It is also understood that, similar to pre-assignment of colors before converting the conflict graph to a CNF expression, simplifying the conflict graph in process P8 can include pre-assigning colors to one or more nodes. This pre-assignment can occur before executing process P18 to determine whether the conflict graph and/or its uncolored partitions are colorable. In this case, nodes of the conflict graph connected to a pre-colored node with a conflict arc will be limited to one less than the total number of colors (i.e., only two colors for the node triple patterned design). In this situation, the Boolean expression for the particular node and its corresponding conflict arcs can be reduced by one color to limit the number of clauses based on the simplification and pre-assignment of colors.

Figure 15:
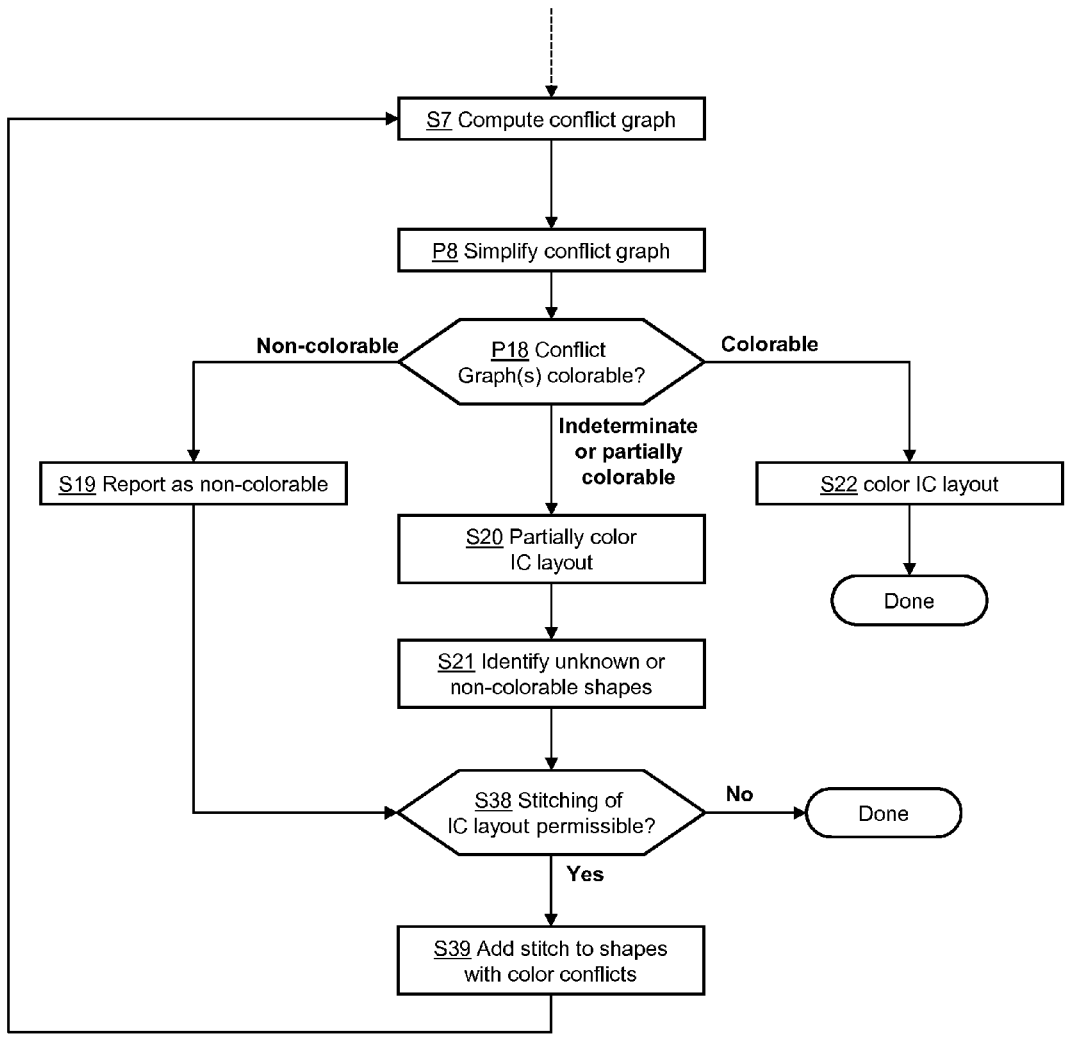

Turning to FIGS. 3 and 15 together, embodiments of the present disclosure can include further steps for reducing color conflicts in multiple patterned designs. In step S38, determinator 322 can determine whether the application of "stitching" to particular shapes, as discussed herein with respect to FIG. 1, is permissible for proposed IC layout 350. Stitching refers to the process of dividing a polygonal shape (e.g., in an M1 layer) into horizontal and/or vertical shape lines and/or splitting a shape line (e.g., in a CA layer) across its midpoint into two shapes. Each stitched shape does not necessarily need to be assigned a different color in the conflict graph, thereby allowing some color conflicts to be resolved immediately. Whether proposed IC layout 350 is eligible for stitching can be determined by use of an algorithm or technique stored within conflict resolution program 306 and/or triple patterning system 318. In addition or alternatively a user can instruct (e.g., with I/O device 315) conflict resolution program 306 as to whether stitching of proposed IC layout 350 is permissible. In the event that stitching is not permitted, the process can end.

Where stitching of proposed IC layout 350 is permissible, the method can proceed to step S39 of mapping module 330 adding stitches to one or more shapes with color conflicts. As shown in FIG. 15, stitching can be applicable to IC layouts that were previously determined to be non-colorable, indeterminate, or partially colorable. After mapping module 330 adds stitches to particular shapes in step S39, the method can return to S7 where the conflict graph is computed again with the stitched shapes being included.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

Any combination of one or more computer readable medium(s) may be used. A computer readable storage medium may be, for example, an electronic, magnetic, optical, electromagnetic, infrared, or semiconductor system, apparatus, or device, or any suitable combination of the foregoing. More specific examples (a non-exhaustive list) of the computer readable storage medium would include the following: an electrical connection having one or more wires, a portable computer diskette, a hard disk, a random access memory (RAM), a read-only memory (ROM), an erasable programmable read-only memory (EPROM or Flash memory), an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

Program code embodied on a computer readable medium may be transmitted using any appropriate medium, including but not limited to wireless, wireline, optical fiber cable, RF, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of the present invention are described above with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer readable medium that can direct a computer, other programmable data processing apparatus, or other devices to function in a particular manner, such that the instructions stored in the computer readable medium produce an article of manufacture including instructions which implement the function/act specified in the flowchart and/or block diagram block or blocks. The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

As used herein, the term "configured," "configured to" and/or "configured for" can refer to specific-purpose features of the component so described. For example, a system or device configured to perform a function can include a computer system or computing device programmed or otherwise modified to perform that specific function. In other cases, program code stored on a computer-readable medium (e.g., storage medium), can be configured to cause at least one computing device to perform functions when that program code is executed on that computing device. In these cases, the arrangement of the program code triggers specific functions in the computing device upon execution. In other examples, a device configured to interact with and/or act upon other components can be specifically shaped and/or designed to effectively interact with and/or act upon those components. In some such circumstances, the device is configured to interact with another component because at least a portion of its shape complements at least a portion of the shape of that other component. In some circumstances, at least a portion of the device is sized to interact with at least a portion of that other component. The physical relationship (e.g., complementary, size-coincident, etc.) between the device and the other component can aid in performing a function, for example, displacement of one or more of the device or other component, engagement of one or more of the device or other component, etc.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for reducing color conflicts in triple patterned Integrated Circuit (IC) designs, the method comprising:
    using a computing device to perform actions including:
        applying a design rule check (DRC) on a proposed IC layout, wherein the DRC applies a set of restrictive design rules (RDRs) in response to the proposed IC layout being a local interconnect (CA) layout, the set of RDRs including:
            forbidding two opposing pairs of shape line ends from being positioned less than a minimum different color distance apart, wherein the minimum different color distance is a minimum separation between two shapes assigned to different colors;
            forbidding each shape line from being at less than a mask layer distance from more than two shapes in a particular adjacent row, wherein the mask layer distance is a minimum separation between two shapes assigned to a single color; and
            forbidding two pairs of opposing ends of each shape line from being at less than the mask layer distance from an adjacent shape;
        computing a conflict graph for the proposed IC layout in response to one of the IC layout being a metal layer and the set of RDRs being satisfied;
        determining whether the conflict graph is one of non-colorable, indeterminate, partially colorable, and fully colorable; and
        partially coloring the IC layout and identifying non-colorable shapes in response to the conflict graph being indeterminate or partially colorable.

2. The method of claim 1, wherein the determining of whether the conflict graph is one of non-colorable, indeterminate, partially colorable, and fully colorable includes converting the conflict graph into one of a four-color conjunctive normal form (CNF), a three-color CNF, and a reduced three-color CNF.

3. The method of claim 1, wherein the determining of whether the conflict graph is one of non-colorable, indeterminate, partially colorable, and fully colorable includes:
    converting the conflict graph into a three-color CNF and applying a Boolean Satisfiability (SAT) solver algorithm to the converted three-color CNF;
    converting the conflict graph into a four-color CNF and applying the SAT solver algorithm to the converted four-color CNF in response to the converted three-color CNF conflict graph being indeterminate.

4. The method of claim 1, wherein the determining of whether the conflict graph is one of non-colorable, indeterminate, partially colorable, and fully colorable includes converting the conflict graph into a three-color CNF and applying a Boolean Satisfiability (SAT) solver algorithm to the converted three-color CNF.

5. The method of claim 4, further comprising converting the conflict graph into a four-color CNF and applying one of a SAT solver algorithm and a Pseudo-Boolean optimization (PBO) algorithm to the converted four-color CNF in response to the converted three-color CNF conflict graph being one of non-colorable and indeterminate; and partially coloring the IC layout and identifying non-colorable shapes based on a solution provided with one of the SAT solver algorithm and the PBO algorithm.

6. The method of claim 4, wherein the SAT solver algorithm comprises a maximum satisfiability problem (MAX-SAT) algorithm, and further comprising partially coloring the IC layout and identifying non-colorable shapes based on a solution provided with the MAX-SAT algorithm.

7. The method of claim 1, wherein the computing of the conflict graph for the proposed IC layout further includes:
calculating a number of neighbor nodes for each node in the proposed IC layout, each neighbor node being separated by less than the mask layer distance from its respective node;
removing each node having at most two neighbor nodes from the conflict graph;
repeating the removing step in response to at least one remaining node of the conflict graph having two or fewer neighbor nodes after the removing of each node having at most two neighbor nodes from the conflict graph;
assigning colors to each node removed from the conflict graph in a reverse order from their removal from the conflict graph; and
restoring the nodes with assigned colors to the conflict graph.

8. The method of claim 7, wherein the assigning of colors to each node having two or fewer neighbor nodes includes:
defining a node chain having a plurality of nodes, wherein the node chain includes a first terminal node having exactly two neighbor nodes and a second terminal node having at most two uncolored neighbor nodes;
assigning a first color to the first terminal node; and
assigning a color to each of the remaining nodes within the node chain such that adjacent nodes within the node chain do not have the same color.

9. The method of claim 7, wherein the assigning of the first color to the first terminal node and the assigning of colors to the remaining nodes are performed substantially simultaneously with the determining of whether the conflict graph is one of non-colorable, indeterminate, partially colorable, and fully colorable, and the partial coloring of the IC layout.

10. The method of claim 1, further comprising assigning one of three colors to each node separated by the mask layer distance at most one other node, and limit the at most one other node to being assigned one of two colors.

11. A program product stored on a computer readable storage medium, the program product operative to reduce color conflicts in triple patterned Integrated Circuit (IC) designs when executed, the computer readable storage medium comprising program code for:
applying a design rule check (DRC) on a proposed IC layout, wherein the DRC applies a set of restrictive design rules (RDRs) in response to the proposed IC layout being a local interconnect (CA) layout, the set of RDRs including:
forbidding two opposing pairs of shape line ends from being positioned less than a minimum different color distance apart, wherein the minimum different color distance is a minimum separation between two shapes assigned to different colors;
forbidding each shape line from being at less than a mask layer distance from more than two shapes in a particular adjacent row, wherein the mask layer distance is a minimum separation between two shapes assigned to a single color; and
forbidding two pairs of opposing ends of each shape line from being at less than the mask layer distance from an adjacent shape;
computing a conflict graph for the proposed IC layout in response to one of the IC layout being a metal layer and the set of RDRs being satisfied;
determining whether the conflict graph is one of non-colorable, indeterminate, partially colorable, and fully colorable; and
partially coloring the IC layout and identifying non-colorable shapes in response to the conflict graph being indeterminate or partially colorable.

12. The program product of claim 11, wherein the determining of whether the IC layout is one of non-colorable, indeterminate, partially colorable, and fully colorable includes converting the conflict graph into one of a four-color conjunctive normal form (CNF), a three-color CNF, and a reduced three-color CNF.

13. The program product of claim 11, wherein the determining of whether the IC layout is one of non-colorable, indeterminate, partially colorable, and fully colorable includes:
converting the conflict graph into a three-color CNF and applying a Boolean Satisfiability (SAT) solver algorithm to the converted three-color CNF conflict graph;
converting the conflict graph into a four-color CNF and applying the SAT solver algorithm to the converted four-color CNF in response to the converted three-color CNF conflict graph being indeterminate.

14. The program product of claim 11, wherein the determining of whether the IC layout is one of non-colorable, indeterminate, partially colorable, and fully colorable includes converting the conflict graph into three-color CNF and applying a Boolean Satisfiability (SAT) solver algorithm to the converted three-color CNF.

15. The program product of claim 14, wherein the SAT solver algorithm comprises a maximum satisfiability problem (MAX-SAT) algorithm, and further comprising program code for partially coloring the IC layout and identifying non-colorable shapes based on a solution provided with the MAX-SAT algorithm.

16. The program product of claim 11, further comprising program code for:
determining whether stitching of the IC layout is permissible;
adding a stitch to at least one shape with a color conflict in response to stitching of the IC layout being permissible and the conflict graph being non-colorable, indeterminate, or partially colorable; and
recomputing the conflict graph for the proposed IC layout.

17. The program product of claim 11, wherein the computing of the conflict graph for the proposed IC layout further includes program code for:
calculating a number of neighbor nodes for each node in the proposed IC layout, each neighbor node being separated by less than the mask layer distance from its respective node;
removing each node having at most two neighbor nodes from the conflict graph;
repeating the removing step in response to at least one remaining node of the conflict graph having two or fewer neighbor nodes after the removing of each node having at most two neighbor nodes from the conflict graph;
assigning colors to each node removed from the conflict graph in a reverse order from their removal from the conflict graph; and
restoring the nodes with assigned colors to the conflict graph.

18. The program product of claim 17, wherein the assigning of colors to each node having two or fewer neighbors includes:
defining a node chain having a plurality of nodes, wherein the node chain includes a first terminal node having exactly two neighbor nodes and a second terminal node having at most two uncolored neighbor nodes;
assigning a first color to the first terminal node; and assigning a color to each of the remaining nodes within the node chain such that adjacent nodes within the node chain do not have the same color.

19. The program product of claim 11, further comprising program code for assigning one of three colors to each node coupled to at most one other node, and limiting the at most one other node to being assigned one of two colors.

20. A system for reducing color conflicts in triple patterned Integrated Circuit (IC) designs, the system comprising:
- a design rule check (DRC) component configured to examine a proposed IC layout, wherein the DRC component applies a set of restrictive design rules (RDRs) in response to the proposed IC layout being a local interconnect (CA) layout, the set of RDRs including:
    - forbidding two opposing pairs of shape line ends from being positioned less than a minimum different color distance apart, wherein the minimum different color distance is a minimum separation between two shapes assigned to different colors;
    - forbidding each shape line from being at less than a mask layer distance from more than two shapes in a particular adjacent row, wherein the mask layer distance is a minimum separation between two shapes assigned to a single color; and
    - forbidding two pairs of opposing ends of each shape line from being at less than the mask layer distance from an adjacent shape;
- a computing component configured to compute a conflict graph for the proposed IC layout in response to one of the IC layout being a metal layer and the set of RDRs being satisfied;
- a determinator component configured to determine whether the conflict graph is one of non-colorable, indeterminate, partially colorable, and fully colorable; and
- an assignor component configured to partially color the IC layout and identifying non-colorable shapes in response to the conflict graph being indeterminate or partially colorable.

* * * * *